United States Patent
Krattiger

(10) Patent No.: US 11,044,791 B2
(45) Date of Patent: Jun. 22, 2021

(54) MULTI-INPUT POWER SUPPLY SYSTEM AND METHOD OF USING THE SAME

(71) Applicant: ERP POWER, LLC, Moorpark, CA (US)

(72) Inventor: Steven C. Krattiger, Northridge, CA (US)

(73) Assignee: ERP POWER, LLC, Moorpark, CA (US)

( * ) Notice: Subject to any disclaimer, the term of this patent is extended or adjusted under 35 U.S.C. 154(b) by 0 days.

(21) Appl. No.: 16/905,421

(22) Filed: Jun. 18, 2020

(65) Prior Publication Data

US 2020/0413510 A1  Dec. 31, 2020

Related U.S. Application Data

(60) Provisional application No. 62/867,052, filed on Jun. 26, 2019.

(51) Int. Cl.

| | |
|---|---|
| *H05B 45/325* | (2020.01) |
| *H05B 45/37* | (2020.01) |
| *H05B 47/14* | (2020.01) |
| *G01R 23/15* | (2006.01) |
| *H05B 45/10* | (2020.01) |
| *G01R 19/165* | (2006.01) |
| *G01R 29/027* | (2006.01) |
| *H05B 47/19* | (2020.01) |

(52) U.S. Cl.
CPC ..... *H05B 45/325* (2020.01); *G01R 19/16528* (2013.01); *G01R 23/15* (2013.01); *G01R 29/0273* (2013.01); *H05B 45/10* (2020.01); *H05B 45/37* (2020.01); *H05B 47/14* (2020.01); *H05B 47/19* (2020.01)

(58) Field of Classification Search
CPC .............................. H05B 45/325; H05B 45/10
See application file for complete search history.

(56) References Cited

U.S. PATENT DOCUMENTS

| | | | |
|---|---|---|---|
| 2016/0183339 A1* | 6/2016 | Sellers | H05B 47/19 315/287 |
| 2019/0182921 A1* | 6/2019 | Li | H05B 45/10 |

\* cited by examiner

*Primary Examiner* — Raymond R Chai
(74) *Attorney, Agent, or Firm* — Lewis Roca Rothgerber Christie LLP

(57) ABSTRACT

A method of controlling a power supply in a multi-input power supply system includes retrieving a prior input state flag from a memory of the multi-input power supply system, determining a first dimmer input of the multi-input power supply system based on the prior input state flag, determining whether the first dimmer input is currently valid, and in response to determining that the first dimmer input is not valid, determining whether a second dimmer input of the multi-input power supply system is currently valid, and in response to determining that the second dimmer input is valid, controlling the power supply based on a second input signal received through the second dimmer input.

20 Claims, 6 Drawing Sheets

MULTI-INPUT POWER SUPPLY SYSTEM AND METHOD OF USING THE SAME

CROSS-REFERENCE TO RELATED APPLICATION(S)

This application claims priority to, and the benefit of, U.S. Provisional Application No. 62/867,052 ("TRIAC DETECTION SOFTWARE"), filed on Jun. 26, 2019, the entire content of which is incorporated herein by reference.

The present application is also related to U.S. patent application Ser. No. 16/905,407, entitled "HIGH PERFORMANCE DIMMING BASED ON DIMMER SLEW-RATE", filed on Jun. 18, 2020, which claims priority to and the benefit of U.S. Provisional Application No. 62/867,027 ("HIGH PERFORMANCE DIMMING BASED ON DIMMER SLEW-RATE"), filed on Jun. 26, 2019, the entire contents of which are incorporated herein by reference.

The present application is also related to U.S. patent application Ser. No. 16/905,501, entitled "SYSTEM AND METHOD FOR MULTI-SLOPE CONTROL OF LIGHTING INTENSITY", filed on Jun. 18, 2020, which claims priority to and the benefit of U.S. Provisional Application No. 62/867,056 ("MULTI-SLOPE TRIAC CONTROL OF LIGHTING INTENSITY"), filed on Jun. 26, 2019, the entire contents of which are incorporated herein by reference.

The present application is also related to U.S. patent application Ser No. 16/905,461, entitled "SYSTEM AND METHOD FOR INVALID PULSE REJECTION", filed on Jun. 18, 2020, which claims priority to and the benefit of U.S. Provisional Application No. 62/866,371 ("MISSING PULSE CORRECTION FOR PROGRAMMABLE TRIAC CONTROL DRIVERS"), filed on Jun. 25, 2019, the entire contents of which are incorporated herein by reference.

The present application is also related to U.S. patent application Ser. No. 16/905,438, entitled "DYNAMIC FILTERING FOR SMOOTH DIMMING OF LIGHTS", filed on Jun. 18, 2020, which claims priority to and the benefit of U.S. Provisional Application No. 62/866,392 ("UTILIZING DYNAMIC FILTERING FOR SMOOTH DIMMING OF LIGHTS"), filed on Jun. 25, 2019, the entire contents of which are incorporated herein by reference.

The present application is also related to U.S. patent application Ser. No. 16/905,516, entitled "MOVEMENT-BASED DYNAMIC FILTERING FOR SMOOTH DIMMING OF LIGHTS", filed on Jun. 18, 2020, which claims priority to and the benefit of U.S. Provisional Application No. 62/866,392 ("UTILIZING DYNAMIC FILTERING FOR SMOOTH DIMMING OF LIGHTS"), filed on Jun. 25, 2019, the entire contents of which are incorporated herein by reference.

FIELD

Aspects of the present disclosure are related to a power supply system and a method of operating the same.

BACKGROUND

Light dimmers have been on the market for many years and consist of primarily two types: Analog 0-10V dimmers and Phase-Cut Triac dimmers. In general, power-supplies designed for lighting have a single input used for dimming a connected light. This input traditionally has been either a 0V-10V analog dimming signal, or a phase-cut Triac input to adjust the light intensity. Generally, manufacturers produce independent supplies that work on one or the other type of dimmer input, resulting in multiple product stock keeping units (SKUs), and confusion for customers who may not know the type of dimmers installed, or even know the difference between 0V-10V vs. Triac dimmers.

The above information disclosed in this Background section is only for enhancement of understanding of the disclosure, and therefore it may contain information that does not form the prior art that is already known to a person of ordinary skill in the art.

SUMMARY

Aspects of embodiments of the present disclosure are directed to a multi-input power supply capable of reliable and automatic input detection (e.g., analog 0-10V input, phase-cut input, vs. bluetooth input) and switchover between analog 0-10V, phase-cut inputs, and bluetooth inputs. According to some embodiments, the power supply stores a last known state to assure correct power-up, performs input validity check, and provides smooth transition changeover.

According to some embodiments of the present disclosure, there is provided a method of controlling a power supply in a multi-input power supply system, the method including: retrieving a prior input state flag from a memory of the multi-input power supply system; determining a first dimmer input of the multi-input power supply system based on the prior input state flag; determining whether the first dimmer input is currently valid; and in response to determining that the first dimmer input is not valid, determining whether a second dimmer input of the multi-input power supply system is currently valid; and in response to determining that the second dimmer input is valid, controlling the power supply based on a second input signal received through the second dimmer input.

In some embodiments, the prior input state flag is an unset flag, a phase-cut input flag, an analog-0-10V input flag, or a wireless-input flag.

In some embodiments, the first dimmer input is one of a phase-cut input, an analog input, and a bluetooth input, and the second dimmer input is another one of a phase-cut input, an analog 0-10V input, and a bluetooth input.

In some embodiments, the method further includes, in response to determining that the second dimmer input is valid: changing the prior input state flag to correspond to the second input signal; and storing the prior input state flag in the memory.

In some embodiments, the method further includes, in response to determining that the first dimmer input is valid, controlling the power supply based on a first input signal received through the first dimmer input.

In some embodiments, the method further includes: in response to determining that the second dimmer input is not valid, determining whether a third dimmer input of the multi-input power supply system is currently valid; and in response to determining that the third dimmer input is valid, controlling the power supply based on a third input signal received through the third dimmer input.

In some embodiments, the method further includes, in response to determining that the third dimmer input is valid: changing the prior input state flag to correspond to the third input signal; and storing the prior input state flag in the memory.

In some embodiments, the method of claim 6, further includes, in response to determining that the third dimmer input is not valid, generating a control signal with maximum value to set a light source coupled to the power supply to a highest brightness.

In some embodiments, determining whether the first dimmer input is currently valid includes: measuring a voltage at the first dimmer input; comparing the voltage with a threshold; and in response to determining that the voltage is less than or equal to the threshold, determining the first dimmer input as valid.

In some embodiments, determining whether the first dimmer input is currently valid further includes: in response to determining that the voltage is greater than the threshold, determining the first dimmer input as not valid.

In some embodiments, the threshold is about 9.5 V to about 9.8 V.

In some embodiments, the determining whether the first dimmer input is currently valid includes: detecting a plurality of PWM pulses at the first dimmer input; determining whether the plurality of PWM pulses are consistent; and in response to determining that the plurality of PWM pulses are consistent, determining the first dimmer input as valid.

In some embodiments, the detecting the plurality of PWM pulses at the first dimmer input includes: receiving a plurality of phase-cut AC signal pulses; and converting the plurality of chopped AC signal pulses to the plurality of PWM pulses.

In some embodiments, the determining whether the plurality of PWM pulses are consistent includes: measuring duty cycles of the plurality of PWM pulses; determining whether the duty cycles are within a percentage threshold of each other; in response to determining that all of the duty cycles are within percentage threshold of each other, identifying the plurality of PWM pulses as consistent; and in response to determining that the duty cycles are not within percentage threshold of each other, identifying the plurality of PWM pulses as not consistent.

In some embodiments, the determining whether the first dimmer input is currently valid includes: determining whether the multi-input power supply system is provisioned into a wireless network; and in response to determining that the multi-input power supply system is provisioned into the wireless network, determining the first dimmer input as valid.

In some embodiments, the determining whether the first dimmer input is currently valid further includes, in response to determining that the multi-input power supply system is not provisioned into the wireless network, determining the first dimmer input as not valid.

According to some embodiments of the present disclosure, there is provided a power supply controller coupled to a power supply, the power supply controller including: a processor; and a processor memory local to the processor, wherein the processor memory has stored thereon instructions that, when executed by the processor, cause the processor to perform: retrieving a prior input state flag from a memory of the power supply controller; determining a first dimmer input of the power supply controller based on the prior input state flag; determining whether the first dimmer input is currently valid; and in response to determining that the first dimmer input is not valid, determining whether a second dimmer input of the power supply controller is currently valid; and in response to determining that the second dimmer input is valid, controlling the power supply based on a second input signal received through the second dimmer input.

In some embodiments, controlling the power supply based on the second input signal includes: generating a control signal corresponding to the second input signal for transmission to the power supply.

In some embodiments, the instructions, when executed by the processor, further cause the processor to perform, in response to determining that the second dimmer input is valid: changing the prior input state flag to correspond to the second input signal; and storing the prior input state flag in the memory.

In some embodiments, the instructions, when executed by the processor, further cause the processor to perform: in response to determining that the second dimmer input is not valid, determining whether a third dimmer input of the multi-input power supply system is currently valid; and in response to determining that the third dimmer input is valid, controlling the power supply based on a third input signal received through the third dimmer input.

BRIEF DESCRIPTION OF THE DRAWINGS

The accompanying drawings, together with the specification, illustrate example embodiments of the present disclosure, and, together with the description, serve to explain the principles of the present disclosure.

DETAILED DESCRIPTION

The detailed description set forth below is intended as a description of example embodiments of a multi-input power supply and a method of its operation, provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the spirit and scope of the disclosure. As denoted elsewhere herein, like element numbers are intended to indicate like elements or features.

Light dimmers have been on the market for many years and are predominantly of three types: phase-cut dimmers, analog 0-10V dimmers, and wireless dimmers. According to some embodiments, the power supply system is configured to support multiple inputs and seamlessly switch to whichever dimmer input is active.

In most use cases, when a multi-input power-supply system is purchased and installed, this detection and switchover may be done once at power-up, and that dimmer input remains the active input for the life of the power-supply system. However, there are other portable uses where stationary lights may be setup and moved/changed periodically, such as in the movie industry, indoor agriculture, etc., and having the flexibility of using different dimming inputs is highly desirable.

According to some embodiments, the power supply can reliably function with multiple potential inputs, while at the same time producing a smooth start-up, ignoring any instability at power-up. In order to produce a clean, smooth ramp up in light intensity, the multi-input power supply system retains the last known dimmer input and uses that at power-up and confirms that the current dimmer input is active.

Figure 1:
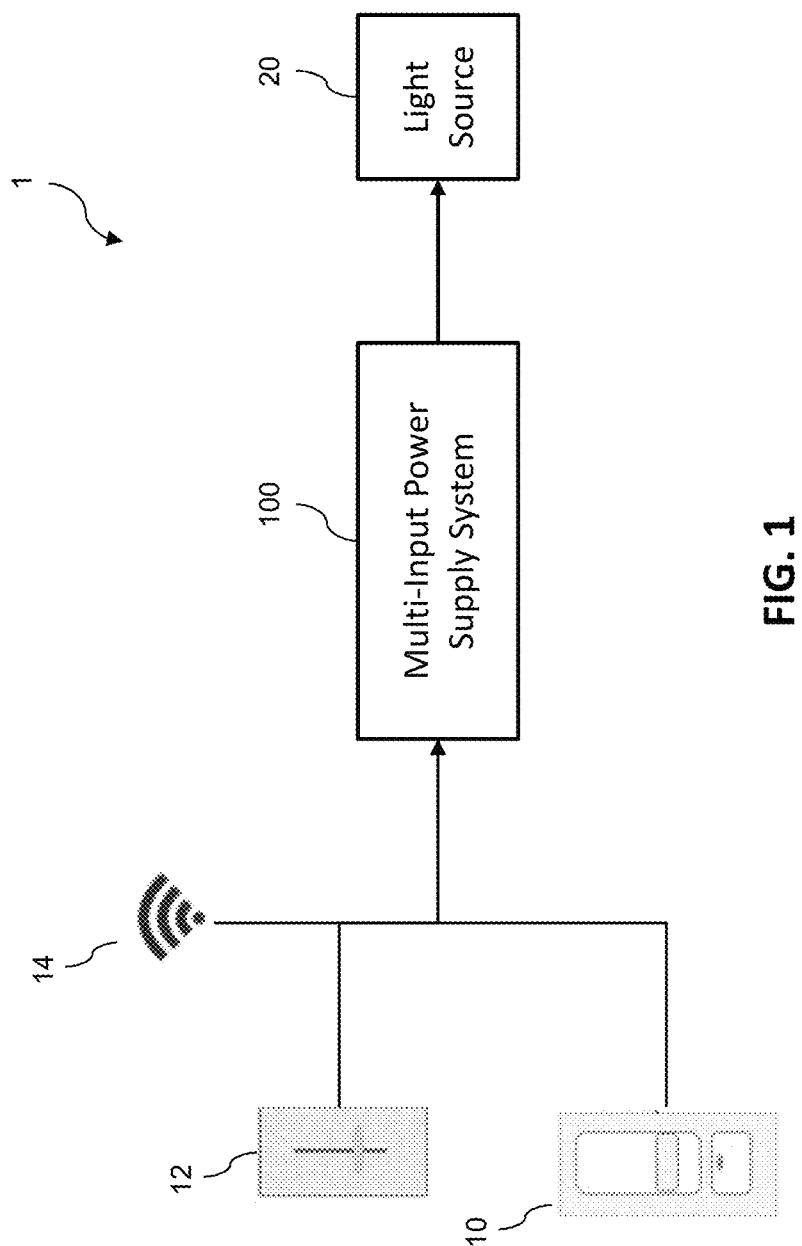
FIG. 1 is a block diagram of a lighting system utilizing a multi-input power supply system, according to some embodiments of the present disclosure.

FIG. 1 is a block diagram of a lighting system 1 utilizing a multi-input power supply system 100, according to some embodiments of the present disclosure.

The lighting system 1 includes a dimmer, the multi-input power supply system 100 (e.g., a tri-mode power supply system), and a light source 20. The light source 20 may include one or more light-emitting-diodes (LEDs). The multi-input power supply system 100 controls the light intensity of the light source 20 based on the dimmer setting. In some embodiments, the dimmer is any one of a phase-cut dimmer 10, an analog 0-10V dimmer 12, and a wireless dimmer (e.g., a bluetooth dimmer) 14. According to some examples, the dimmer interface may be a rocker interface, a tap interface, a slide interface, a rotary interface, a user interface of a web or mobile application (App), or the like. A user may adjust the dimmer level/setting by, for example, adjusting a position of a dimmer lever or a rotation of a rotary dimmer knob, or changing a setting in the user interface of an APP.

When active (e.g., available), the phase-cut dimmer 10 receives an AC input signal (e.g., a 120 V AC signal from the wall) and modifies (e.g., cuts/chops a portion of) the AC input voltage sinewave signal according to the dimmer level before sending it to the power supply system 100, and thus variably reduces the electrical power delivered to the power supply system 100. The power supply system 100 in turn produces a drive signal (e.g., an output current or voltage) that is proportional to the reduced power provided by the dimmer 10 and provides the drive signal to the light source 20. Thus, the light output of the light source 20 may be proportional to the phase angle of the modified sine wave. This results in the dimming of the light output. In some examples, the phase-cut dimmer 10 may be a triac dimmer or an electronic-low-voltage (ELV) dimmer, and may chop the leading edge or trailing edge of the AC input signal. When no phase-cut dimmer 10 is available, the AC input signal may be applied directly to the power supply system 100, in which case the power supply system 100 may receive an unmodified sinusoidal signal.

The analog 0-10V dimmer 12, when active (e.g., available), reduces a 10 V signal provided by the power supply system 100, according to the dimmer level. For example, when the dimmer is set to 100%, 50% or 0%, the analog 0-10V dimmer 12 respectively provides a voltage of about 10 V, about 5 V, or about 0 V.

When the wireless dimmer 14 is active, a user interface sets the dimming setting, which is communicated to the power supply system 100. The multi-input power supply system 100 in turn controls the light intensity of the light source 20 based on the communicated dimmer setting. In some examples, the wireless dimmer 14 may be a bluetooth-connected (e.g., a bluetooth-paired) dimmer.

According to some embodiments, a single multi-input power supply system 100 is capable of performing dimming operations based on any of a number of dimming inputs. In some embodiments, the power supply system 100 powers up using a last known dimmer input, and if that particular dimming input is no longer valid, it detects which of the other dimmer inputs are available. Once a dimmer input is identified as being active, the power supply system 100 performs dimming operations based on the identified dimmer input.

Figure 2:
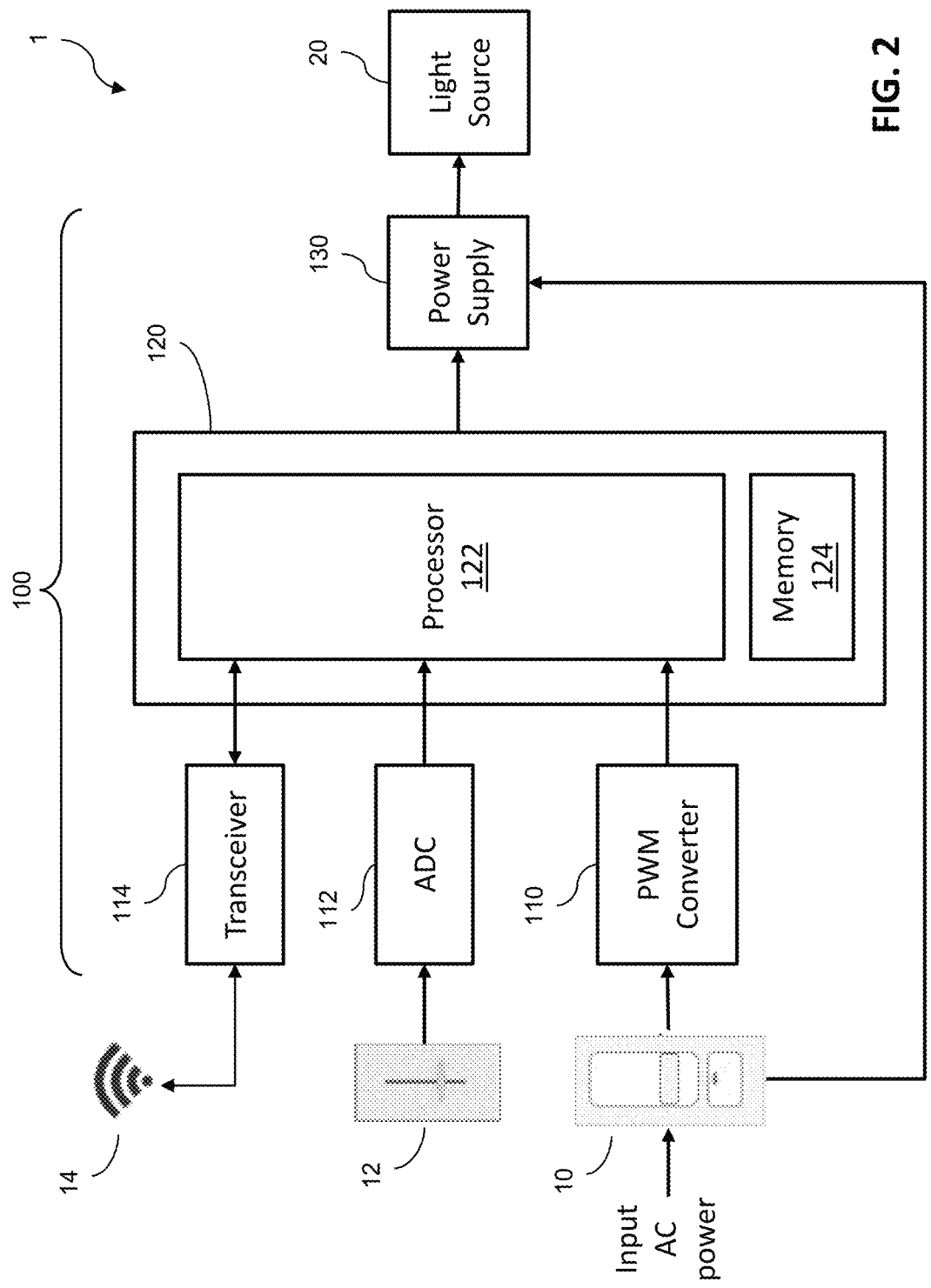
FIG. 2 is block diagram of the multi-input power supply system within the lighting system, according to some embodiments of the present disclosure.

FIG. 2 is block diagram of the multi-input power supply system 100 within the lighting system 1, according to some embodiments of the present disclosure.

In some embodiments, the power supply system 100 includes a PWM converter 110, an analog-to digital converter (ADC) circuit 112, a transceiver 114, a power supply controller 120, and a power supply 130.

The PWM converter 110 is configured to convert the modified AC input signal received from the phase-cut dimmer 10 into a pulse width modulation (PWM) signal for processing by the power supply controller 120. The PWM converter 110 may include one or more comparators (e.g., operational amplifiers) that compare the positive and negative swings of the incoming modified AC input signal with one or more set or predefined thresholds to generate a corresponding PWM signal. Thus, the PWM converter 110 maps the dimmed power of the modified AC input signal to pulse width modulations of the PWM signal. In some examples, the duty cycle of the PWM signal represents the dimmer level (i.e., the user setting at the phase-cut dimmer 10). In some examples, a high value in the PWM signal may be about 3.3 V, which may correspond to a logic high (or a binary '1'), and a low value may be about 0 V, which may correspond to a logic low (or binary '0').

In some embodiments, the power supply controller 120 is configured to measure (e.g., continuously measure) the duty cycle of the PWM signal and to generate a sequence of sample values, which may correspond to the dimming levels of the phase-cut dimmer 10 at a plurality of sample times. The power supply controller 120 then generates a control signal based on the sample values, which it provides to the power supply 130.

In some embodiments, the ADC circuit 112 monitors the voltage provided by the analog 0-10V dimmer 12 and converts the voltage to a plurality of digital sample values that the power supply controller 120 uses to generate the control signal. In some examples, instead of an ADC, the analog dimmer input may be coupled (e.g., via an optocoupler/optoisolator) to a PWM generator, which translates the analog dimming input into a PWM signal. The PWM signal may then be interpreted by the power supply controller to determine the dimming level/setting.

The transceiver 114 enables bidirectional communication between the power supply controller and an external device (e.g., a wireless dimmer, a mobile device, other power supply systems, etc.) through a wireless network (e.g., wifi, bluetooth mesh, etc.). Once the power supply system 1020 is provisioned into a wireless network (e.g., a bluetooth mesh network or wifi), the transceiver 114 sets a connection-flag that can be read by the power supply controller 120. In addition, the transceiver 114 may utilize a set of commands to the power supply controller 120 to accomplish a wide array of functions, such as turning the light source 20 on/off, dimming the light source 20, using timed transitions, scheduling on/off times, using color-shifts for ambient mood lighting, etc., as well as collect individual lighting status such as power consumption, supply temperature, motion detected, etc.

As provided above, the power supply controller 120 generates a control signal (e.g., a PWM signal) based on the dimming signal received from one of the PWM converter 110, an ADC circuit 112, a transceiver 114. In some examples, the power supply controller 120 maps the received dimming signal to duty cycles of PWM pulses that form the control signal. In some examples, the control signal is filtered to produce a smooth PWM analog signal that can be used by the power supply to control the light intensity of the light source 20. However, embodiments of the present disclosure are not limited to PWM control signals, and any suitable modulation scheme may be utilized to control the power supply 130, so long as the power supply 130 is properly designed for such a modulation scheme. Thus, in some examples, the control signal may be a pulse amplitude modulation signal, a pulse frequency modulation signal, or a variable DC signal (e.g., a DC voltage ranging from 0 V to 10 V).

The power supply 130 in turn generates a drive signal based on the control signal for powering and controlling the brightness of the light source 20. The drive signal may depend on the type of the one or more LEDs of the light source 20. For example, when the one or more LEDs of the light source 20 are constant current LEDs the drive signal may be a variable voltage signal, and when the light source 20 requires constant voltage, the drive signal may be a variable current signal. The power supply 130 may receive its input power from the modified AC signal from the phase-cut dimmer 10.

According to some embodiments, the power supply controller 120 automatically detects the dimming input that is valid/available, performs frequent validity checks to ensure that the dimming input continues to be valid/available, and stores its last known state (e.g., last known valid dimming input) in the memory 124. In some embodiments, during the power-up phase, the supply starts ramping up based on the last known valid dimming input. After a short delay, the inputs are checked again. If a different input is active (the unit has been installed for the first time), then the supply will store the new active input flag and smoothly switch over and start using the validated input.

In some embodiments, the power supply controller 120 includes a processor 122 and a memory 124. The processor 122 may include, for example, one or more application specific integrated circuits (ASICs), general purpose or special purpose central processing units (CPUs), digital signal processors (DSPs), graphics processing units (GPUs), and programmable logic devices such as field programmable gate arrays (FPGAs). The memory 124 may have instructions stored thereon that, when executed by the processor 122, cause the processor 122 to perform the operations of the power supply controller 120.

Figure 3:
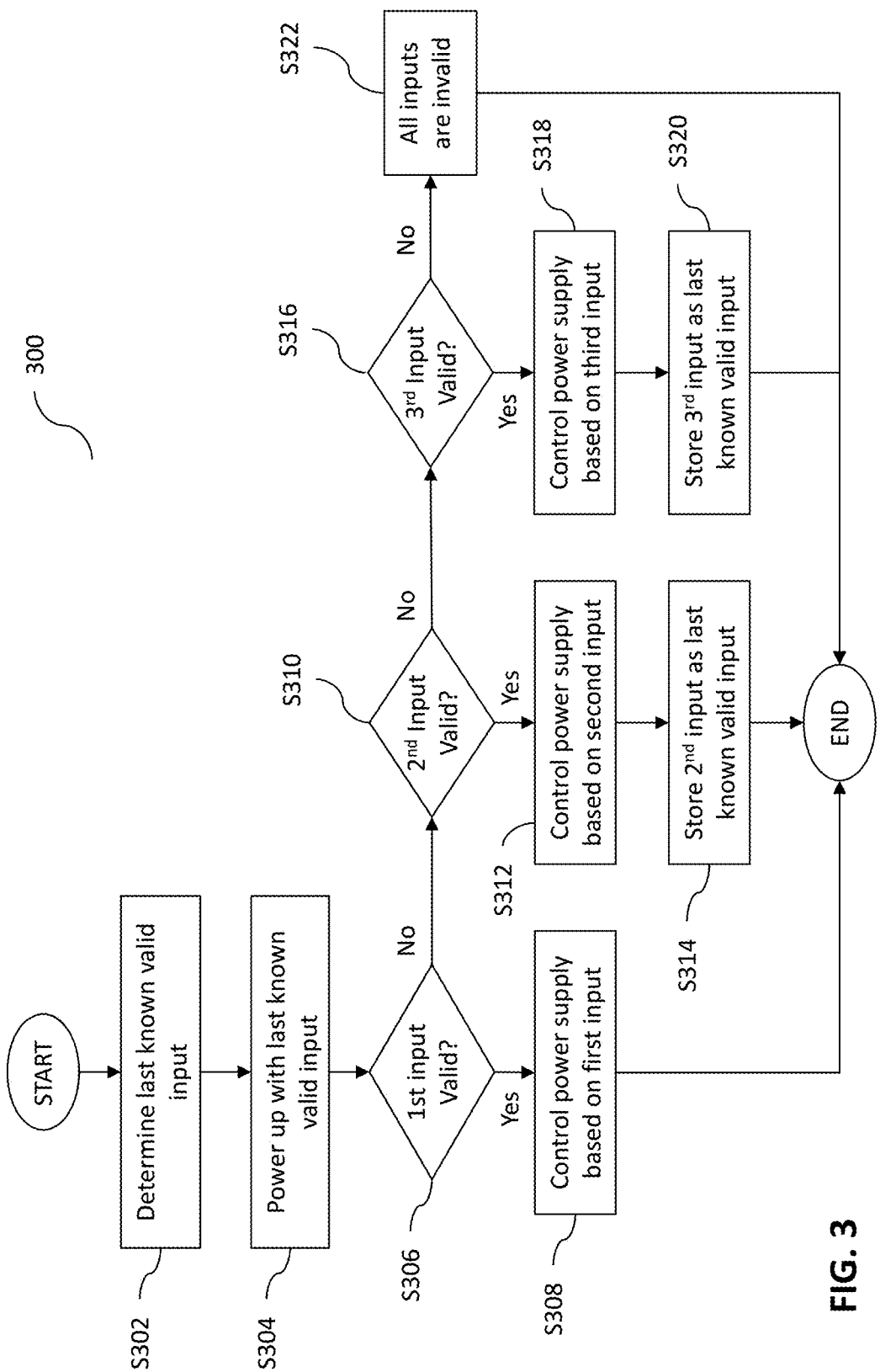
FIG. 3 is a flow diagram illustrating the process of controlling a power supply in a multi-input power supply system, according to some embodiments of the present disclosure.

FIG. 3 is a flow diagram illustrating the process 300 of controlling a power supply 130 in a multi-input power supply system 100, according to some embodiments of the present disclosure.

In some embodiments, when powering up the power supply 130, the power supply controller 120 determines the last known state of the power supply system 100 (e.g., the last known valid dimming input) (S302). In doing so, the power supply controller 120 retrieves a prior input state flag from the memory 124, and determines a first dimmer input of the multi-input power supply system 100 based on the prior input state flag. In some examples, the prior input state flag may be an unset flag indicating that no prior valid input existed (such as when the power supply system is being used for the very first time), a phase-cut input flag indicating that the previous valid input was a phase-cut dimmer, an analog-0-10V input flag indicating that the previous valid input was an analog 0-10V dimmer, or a wireless-input flag indicating that the previous valid input was an wireless (e.g., bluetooth) dimmer. The flags may be stored in the memory 124 as 8-bit binary values.

Once the first dimmer input is identified, the power supply controller 120 powers up the multi-input power supply system 100 based on the identified first dimmer input (S304), and may ramp-up or adjust the control signal to match the dimmer setting. The power supply controller 120 then determines whether the first dimmer input is currently valid (S306). In response to determining that the first dimmer input is valid, the power supply controller 120 controls the power supply based on an input signal (e.g., a first input signal) received through the first dimmer input (S308).

In response to determining that the first dimmer input is not valid, the power supply controller 120 determines whether a second dimmer input of the multi-input power supply system is currently valid (S310). In response to determining that the second dimmer input is valid, the power supply controller 120 controls the power supply 130 based on an input signal (e.g., a second input signal) received through the second dimmer input (S312) and sets the prior input state flag as one of the phase-cut input flag, the analog-0-10V input flag, or the wireless-input flag, which corresponds to the valid second dimmer input (S314).

Similarly, if the second dimmer input is not valid, the power supply controller 120 determines whether a third dimmer input of the multi-input power supply system is currently valid (S316). If the third dimmer input is valid, the power supply controller 120 controls the power supply 130 based on an input signal (e.g., a third input signal) received through the third dimmer input (S318) and sets the prior input state flag as one of the phase-cut input flag, the analog-0-10V input flag, or the wireless-input flag, which corresponds to the valid second dimmer input (S320).

If the third dimmer input is also not valid, then no valid inputs are present (S322) and the power supply controller 120 cannot perform dimming operations. In this state, the power supply controller 120 may default to providing a control signal with maximum value to set the light source to a highest brightness setting. This may be due to the fact that some dimmers are seen as not connected (invalid) at the very high end of operation.

In some embodiments, the choice of the second and third dimmer inputs depends on the identified first dimmer input and a validation priority sequence, which specifies the order in which the different dimmer inputs to the multi-input power supply system 100 are to be checked/validated. For example, the validation priority sequence may indicate the phase-cut dimmer input, the analog 0-10V dimmer input, and the wireless dimmer input as having first, second, and third priority, respectively. In such an example, if the identified first dimmer input is the analog 0-10V dimmer input, the second and third dimmer inputs may be phase-cut dimmer input and the wireless dimmer input. As recognized by a person of ordinary skill in the art, the validation priority sequence may be any suitable ordering/sequence of dimmer inputs.

According to some embodiments, once a dimmer input has been validated, the power supply controller 120 may check the validity of the validated dimmer input at regular intervals. In so doing, once an input is validated, in subsequent validity checks, the power supply controller may identify the most-recently validated dimmer input as the first dimmer input and follow the validation process described above (i.e., S306 to S322). In some examples, the frequency of validity checks is about once in every 0.5 to 3 seconds. Thus, even when all dimmer inputs are determined to be invalid, within a short period of time corresponding to the frequency of validity checks, the power supply controller 120 proceeds to re-validate the dimmer inputs based on the validation priority sequence described above.

Further, while the multi-input power supply system 100 has been described as having three dimmer inputs, embodiments of the present disclosure are not limited thereto. For example, the power supply system 100 may have N dimmer inputs, where N is an integer greater than 1. For example, the power supply system 100 may only be capable of receiving input a phase-cut dimmer and an analog 0-10V dimmer, in which case, the third dimmer input is not checked in the process 300 of FIG. 3, and the power supply controller 120 determines that all dimmer inputs are invalid after checking the first and second dimmer inputs.

Figure 4A:
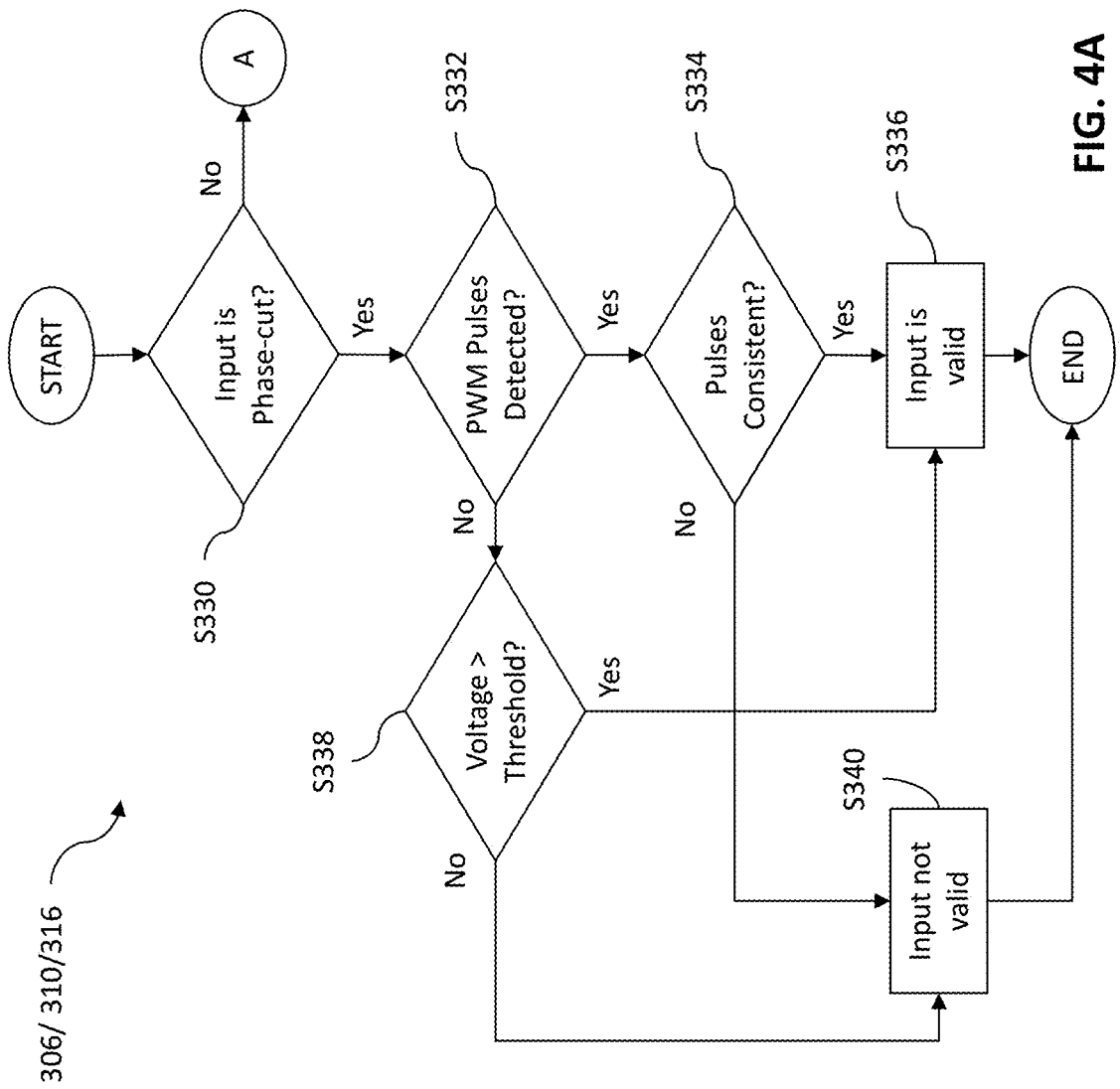
FIGS. 4A-4C is a flow diagram illustrating the process of validating a dimmer input of the multi-input power supply system, according to some embodiments of the present disclosure.
Figure 4B:
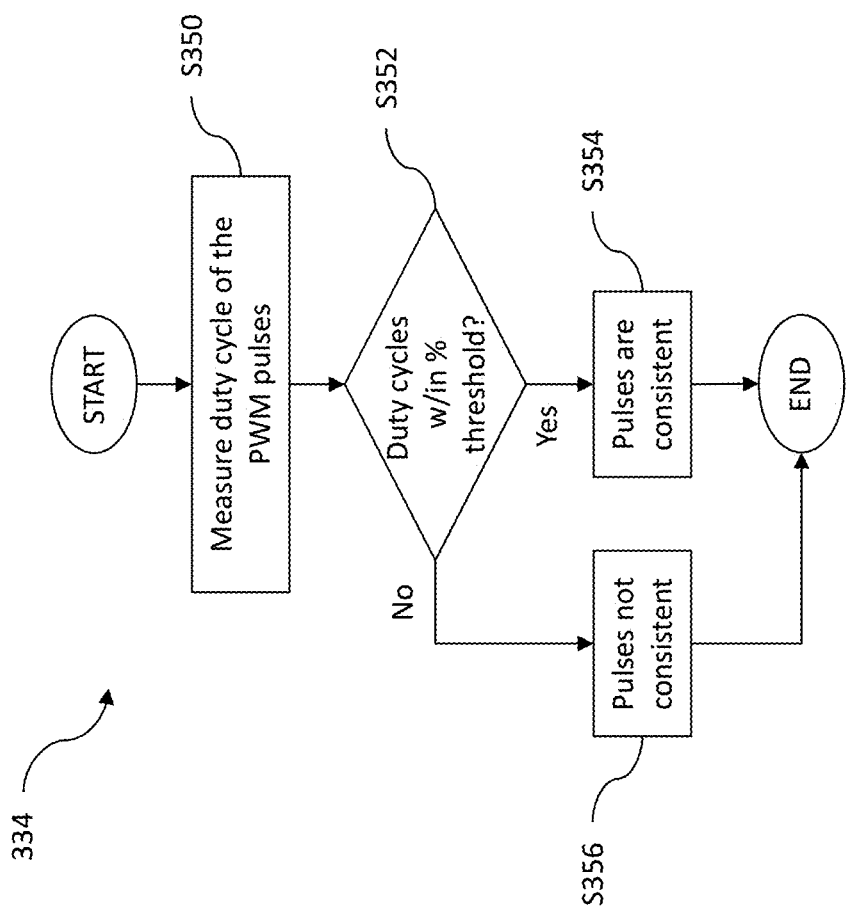
Figure 4C:
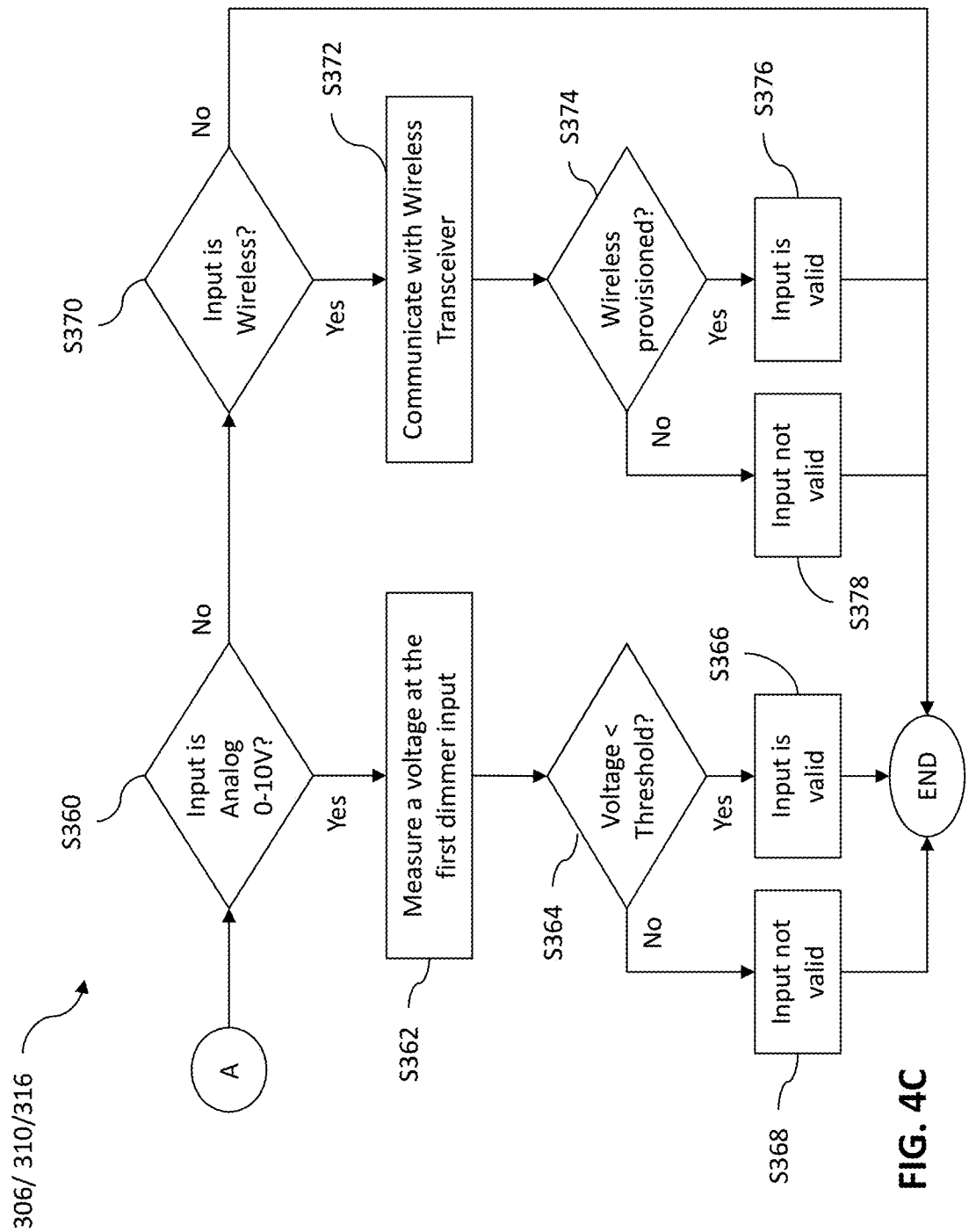

FIGS. 4A to 4C are flow diagrams illustrating the process 306/310/316 of validating a dimmer input of the multi-input power supply system 100, according to some embodiments of the present disclosure. FIG. 4B is a flow diagram illustrating the process 334 of determining whether a plurality of PWM pulses are consistent, according to some embodiments of the present disclosure.

Referring to FIG. 4A, the process for validating a dimmer input depend on the type of dimmer input.

In some embodiments, when the dimmer input is a phase-cut dimmer (S330), the power supply controller 120 monitors the phase-cut dimmer input to detect a plurality of PWM pulses (S332). In some examples, the plurality of PWM pulses may be at least 10 or 15 PWM pulses.

If the PWM pulses are detected, the power supply controller 120 determines whether the plurality of PWM pulses are consistent (e.g., have duty cycles that are within a close range of one another) (S334). If consistent, the power supply controller 120 determines the first dimmer input as valid (S336). If the PWM pulses are inconsistent (e.g., don't have duty cycles that are within a close range of one another), which may happen at power-up, the phase-cut dimmer input is noisy. As this noise may cause erratic light levels, flashing, etc., the power supply controller 120 determines that the input is invalid (S340), and does not switch over to the phase-cut dimmer input until consistent PWM duty-cycle is validated.

Referring to FIG. 4B, in some embodiments, the power supply controller 120 determines consistency by first measuring the duty cycles of the detected PWM pulses (S350). If the duty cycles of a consecutive number of PWM pulse (e.g., of at least 10 or 15 pulses) are within a percentage threshold, the power supply controller 120 determines that the PWM pulses are consistent (S354). Otherwise, it determines that the PWM pulses are not consistent (S356). In some examples, the percentage threshold may be about +/−2% to about +/−5% to reject noise.

Referring again to FIG. 4A, if no PWM pulses are detected, the power supply controller 120 determines whether the output from the PWM converter 110 is at a constant high level (e.g., a logic high). If so, this may indicate that the phase-cut dimmer 10 is at the highest dimmer setting or that the phase-cut dimmer 10 is not present and that the PWM converter 110 is directly connected to the AC signal (e.g., from the wall). In such a case, the power supply controller 120 determines that phase-cut dimmer input is valid (S336) and proceeds to operate based on that input. If, however, a constant high level signal is not detected, the phase-cut dimmer input is determined to be invalid (S340).

Referring now to FIG. 4C, in some embodiments, when the dimmer input is an analog 0-10V dimmer (S360), the power supply controller 120 measures a voltage at the analog 0-10V dimmer input (S362), and compares the voltage with a threshold (S364). In some examples, the threshold may be about 9.5 V to about 9.8 V. This may be done because, in some embodiments, a disconnected analog 0-10V dimmer always presents a maximum 10 volts at the input (e.g., due to a pull up resistor to 10 V supply within the power supply system 100). If any voltage below the threshold is measured on the analog 0-10V dimmer input, it may be assumed that there is a dimmer attached. Accordingly, when the measured voltage is less than the threshold, the power supply controller 120 determines that the analog 0-10V dimmer input is valid (S366). However, if the voltage is above the threshold, it is ambiguous whether an analog 0-10V dimmer is installed, or if it is just set to maximum intensity due to a non-existent analog 0-10V dimmer, and the power supply controller 120 determines that the analog 0-10V dimmer input is not valid (S368).

According to some embodiments, when the dimmer input is a wireless dimmer input (S370), the power supply controller 120 communicates with the transceiver 114 (S372) to determine whether the power supply system 100 is provisioned into a wireless network (S374). If the power supply system 100 is provisioned, the power supply controller 120 determines that the wireless dimmer input is valid (S376), and if the power supply system 100 is not provisioned into a wireless network, the power supply controller 120 determines that the wireless dimmer input is invalid (S378). Once provisioned, the transceiver 114 and power supply controller 120 engage in communication regarding the state of the wireless network (e.g., bluetooth mesh), status, etc.

Accordingly, as described above, a single power supply system according to some embodiments of the present disclosure can produce a dimmable output based on any number of inputs, which can simplify manufacturing and product selection. The power supply provides the ability to change the dimmer input, to support portable and changing use cases. Further, the power supply may have lower overall cost due to the microprocessor taking over former analog functions, as well as handling input selection.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "substantially", "about", and similar terms are used as terms of approximation and not as terms of degree, and are intended to account for the inherent variations in measured or calculated values that would be recognized by those of ordinary skill in the art.

As used herein, the terms "use", "using", and "used" may be considered synonymous with the terms "utilize", "utilizing", and "utilized", respectively.

The multi-input power supply system and/or any other relevant devices or components according to embodiments of the present disclosure described herein may be implemented by utilizing any suitable hardware, firmware (e.g., an application-specific integrated circuit), software, or a suitable combination of software, firmware, and hardware. For example, the various components of the independent multi-source display device may be formed on one integrated circuit (IC) chip or on separate IC chips. Further, the various components of the multi-input power supply system may be implemented on a flexible printed circuit film, a tape carrier package (TCP), a printed circuit board (PCB), or formed on the same substrate. Further, the various components of the multi-input power supply system may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, spirit, and scope of this disclosure, as set forth in the following claims and equivalents thereof.

What is claimed is:

1. A method of controlling a power supply in a multi-input power supply system, the method comprising:
    retrieving a prior input state flag from a memory of the multi-input power supply system;
    determining a first dimmer input of the multi-input power supply system based on the prior input state flag;
    determining whether the first dimmer input is currently valid; and
    in response to determining that the first dimmer input is not valid,
        determining whether a second dimmer input of the multi-input power supply system is currently valid; and
        in response to determining that the second dimmer input is valid,
            controlling the power supply based on a second input signal received through the second dimmer input.

2. The method of claim 1, wherein the prior input state flag is an unset flag, a phase-cut input flag, an analog-0-10V input flag, or a wireless-input flag.

3. The method of claim 1, wherein the first dimmer input is one of a phase-cut input, an analog input, and a bluetooth input, and
    wherein the second dimmer input is another one of the phase-cut input, the analog input, and the bluetooth input.

4. The method of claim 1, further comprising, in response to determining that the second dimmer input is valid:
    changing the prior input state flag to correspond to the second input signal; and
    storing the prior input state flag in the memory.

5. The method of claim 1, further comprising:
    in response to determining that the first dimmer input is valid, controlling the power supply based on a first input signal received through the first dimmer input.

6. The method of claim 1, further comprising:
    in response to determining that the second dimmer input is not valid,
        determining whether a third dimmer input of the multi-input power supply system is currently valid; and
        in response to determining that the third dimmer input is valid,
            controlling the power supply based on a third input signal received through the third dimmer input.

7. The method of claim 6, further comprising, in response to determining that the third dimmer input is valid:
    changing the prior input state flag to correspond to the third input signal; and
    storing the prior input state flag in the memory.

8. The method of claim 6, further comprising:
    in response to determining that the third dimmer input is not valid,
        generating a control signal with maximum value to set a light source coupled to the power supply to a highest brightness.

9. The method of claim 1, wherein determining whether the first dimmer input is currently valid comprises:
    measuring a voltage at the first dimmer input;
    comparing the voltage with a threshold; and
    in response to determining that the voltage is less than or equal to the threshold,
    determining the first dimmer input as valid.

10. The method of claim 9, wherein determining whether the first dimmer input is currently valid further comprises:
    in response to determining that the voltage is greater than the threshold,
    determining the first dimmer input as not valid.

11. The method of claim 9, wherein the threshold is about 9.5 V to about 9.8 V.

12. The method of claim 1, wherein the determining whether the first dimmer input is currently valid comprises:
  detecting a plurality of PWM pulses at the first dimmer input;
  determining whether the plurality of PWM pulses are consistent; and
  in response to determining that the plurality of PWM pulses are consistent,
    determining the first dimmer input as valid.

13. The method of claim 12, wherein the detecting the plurality of PWM pulses at the first dimmer input comprises:
  receiving a plurality of phase-cut AC signal pulses; and
  converting the plurality of chopped AC signal pulses to the plurality of PWM pulses.

14. The method of claim 12, wherein the determining whether the plurality of PWM pulses are consistent comprises:
  measuring duty cycles of the plurality of PWM pulses;
  determining whether the duty cycles are within a percentage threshold of each other;
  in response to determining that all of the duty cycles are within the percentage threshold of each other,
    identifying the plurality of PWM pulses as consistent; and
  in response to determining that the duty cycles are not within the percentage threshold of each other,
    identifying the plurality of PWM pulses as not consistent.

15. The method of claim 1, wherein the determining whether the first dimmer input is currently valid comprises:
  determining whether the multi-input power supply system is provisioned into a wireless network; and
  in response to determining that the multi-input power supply system is provisioned into the wireless network,
    determining the first dimmer input as valid.

16. The method of claim 15, wherein the determining whether the first dimmer input is currently valid further comprises:
  in response to determining that the multi-input power supply system is not provisioned into the wireless network,
    determining the first dimmer input as not valid.

17. A power supply controller coupled to a power supply, the power supply controller comprising:
  a processor; and
  a processor memory local to the processor, wherein the processor memory has stored thereon instructions that, when executed by the processor, cause the processor to perform:
    retrieving a prior input state flag from a memory of the power supply controller;
    determining a first dimmer input of the power supply controller based on the prior input state flag;
    determining whether the first dimmer input is currently valid; and
    in response to determining that the first dimmer input is not valid,
      determining whether a second dimmer input of the power supply controller is currently valid; and
      in response to determining that the second dimmer input is valid,
        controlling the power supply based on a second input signal received through the second dimmer input.

18. The power supply controller of claim 17, wherein controlling the power supply based on the second input signal comprises:
  generating a control signal corresponding to the second input signal for transmission to the power supply.

19. The power supply controller of claim 17, wherein the instructions, when executed by the processor, further cause the processor to perform, in response to determining that the second dimmer input is valid:
  changing the prior input state flag to correspond to the second input signal; and
  storing the prior input state flag in the memory.

20. The power supply controller of claim 17, wherein the instructions, when executed by the processor, further cause the processor to perform:
  in response to determining that the second dimmer input is not valid,
    determining whether a third dimmer input of the power supply controller is currently valid; and
    in response to determining that the third dimmer input is valid,
      controlling the power supply based on a third input signal received through the third dimmer input.

* * * * *